(12) United States Patent
Choi et al.

(10) Patent No.: US 6,936,517 B2
(45) Date of Patent: Aug. 30, 2005

(54) METHOD FOR FABRICATING TRANSISTOR OF SEMICONDUCTOR DEVICE

(75) Inventors: Chee Hong Choi, Busan (KR); Tae Woo Kim, Icheon-si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 52 days.

(21) Appl. No.: 10/747,618

(22) Filed: Dec. 30, 2003

(65) Prior Publication Data

US 2004/0161901 A1 Aug. 19, 2004

(30) Foreign Application Priority Data

Dec. 30, 2002 (KR) .................................. 10-2002-0087307

(51) Int. Cl.⁷ .............................................. H01L 21/00
(52) U.S. Cl. ........................ 438/291; 438/585; 438/592
(58) Field of Search ................................ 438/289–291, 438/585, 592

(56) References Cited

U.S. PATENT DOCUMENTS

| | | | |
|---|---|---|---|
| 5,864,163 A | 1/1999 | Chou et al. | |
| 6,238,988 B1 | 5/2001 | Hsiao et al. | |
| 2002/0081810 A1 * | 6/2002 | Mun et al. | 438/299 |
| 2002/0137294 A1 * | 9/2002 | Wu et al. | 438/289 |
| 2003/0040159 A1 * | 2/2003 | Sasaki | 438/286 |
| 2004/0038483 A1 * | 2/2004 | Tran | 438/279 |
| 2004/0043571 A1 * | 3/2004 | Watt | 438/291 |

FOREIGN PATENT DOCUMENTS

JP 2002-184876 6/2002

* cited by examiner

*Primary Examiner*—Richard A. Booth
(74) *Attorney, Agent, or Firm*—Pillsbury Winthrop Shaw Pittman LLP

(57) ABSTRACT

A method of fabricating a transistor of a semiconductor device is disclosed. The method of fabricating a transistor comprises forming a sacrificial layer on a substrate; forming a source/drain region in the substrate by performing a first ion implantation using the sacrificial layer as a mask; forming a barrier layer over the substrate with the sacrificial layer; removing a portion of the sacrificial layer to form an opening through which a portion of the substrate is exposed; performing a second ion implantation using the opening as a mask to implant ions for adjustment of a threshold voltage of the substrate; forming a gate electrode on the substrate exposed through the opening; and performing a third ion implantation to adjust doping concentration in the gate electrode. Accordingly, the present invention can reduce the occurrences of a short channel effect and a reverse short channel effect in a transistor.

3 Claims, 4 Drawing Sheets

METHOD FOR FABRICATING TRANSISTOR OF SEMICONDUCTOR DEVICE

BACKGROUND OF THE INVENTION

1. Field of the Invention

The present invention relates to a method for fabricating a semiconductor device and, more particularly, to a method for fabricating a transistor of a semiconductor device.

2. Background of the Related Art

Most semiconductor devices comprise transistors. FIGS. 1a through 1e illustrate, in cross-sectional views, the process steps for forming a transistor in a semiconductor device according to a conventional art. Referring to FIG. 1a, a substrate 10 with device isolation layers 12 is provided and an ion implantation is performed on the substrate 10 in order to adjust a threshold voltage. Referring to FIG. 1b, a gate electrode 16 is formed on the substrate 10. Then, a first source/drain region 18 with shallow junction is formed in the substrate 10 by performing an ion implantation using the gate electrode 16 as a mask. Referring to FIGS. 1c and 1d, an insulating layer 20 is deposited over the substrate 10 with the gate electrode 16. Then, an etching process is performed on the insulating layer 20 to form spacers 22 on sidewalls of the gate 16. Referring to FIG. 1e, an ion implantation is performed using the spacers as a mask to form a second source/drain region 30 with deep junction in the substrate 10. Thus, the transistor formed according to the above-mentioned processes comprises the gate electrode 16 and source/drain regions consisting of the first source/drain region 18 and the second source/drain region 30.

As a prior art, U.S. Pat. No. 6,238,988, Hsiao and Tseng, discloses a method of forming a MOS (metal oxide semiconductor) transistor. In the method according to the above-mentioned U.S. patent, a gate is first formed on the silicon substrate of the semiconductor wafer and, then, a first spacer made of silicon nitride and the LDD are formed adjacent to the gate. A conductive layer is formed on the semiconductor wafer that forms a corner on the conjoining section of the spacer and the silicon substrate. A spacer made of silicon oxide is formed on the corner of the conductive layer and, then, an etching process is performed to remove the conductive layer above the gate and the silicon substrate. The conductive layer on the corner adjacent to the first spacer remains. Finally, the spacer made of silicon oxide is completely removed, and an ion implantation process is performed to form a source/drain region on the silicon substrate adjacent to the conductive layer.

As another prior art, U.S. Pat. No. 5,864,163, Chou and Sun, discloses a method of fabricating a MOS device. The method of fabricating a MOS device comprises the steps of forming a gate oxide over a substrate; depositing a first polysilicon layer over the gate oxide; implanting a threshold adjust dopant of a first conductivity type through the polysilicon layer, through the gate oxide and into the substrate; depositing a second layer of gate material over the first polysilicon layer; and forming a gate electrode mask and etching the second layer of gate material to form a gate electrode. In addition, this method also includes the following steps performed before the formation of the gate oxide: forming a sacrificial oxide layer on a surface of the substrate; implanting into the substrate a dopant of a second conductivity type; and etching the sacrificial oxide to expose the surface of the substrate.

However, the above-mentioned conventional methods of fabricating a transistor can cause the following problems.

First, ions in the first source/drain region can be diffused because of a thermal process performed during a process of forming spacers after forming the first source/drain region. Therefore, effective channel length becomes shorter than the channel length determined based on formation of a gate, that is, a short channel effect occurs. Second, when an ion implantation is performed to form the source/drain region, out-diffusion of ions, which are implanted into the substrate to adjust a threshold voltage, occurs because the ions implanted to adjust the threshold voltage are generally light and the ions implanted to form the source/drain region are heavy. In other words, when heavy ions are implanted, they collide with light ions and the light ions are scattered. Therefore, concentration of the ions to adjust the threshold voltage is lowered due to the out-diffusion and thereby a reverse short channel effect is caused.

SUMMARY OF THE INVENTION

Accordingly, the present invention is directed to a method of forming a transistor of a semiconductor device that substantially obviates one or more problems due to limitations and disadvantages of the related art.

An object of the present invention is to provide a method of fabricating a transistor of a semiconductor device, which can prevent a short channel effect and a reverse short channel effect.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In a preferred embodiment, a method of fabricating a transistor of a semiconductor device comprises the steps of:

forming a sacrificial layer on a substrate;

forming a source/drain region in the substrate by performing a first ion implantation using the sacrificial layer as a mask;

forming a barrier layer over the substrate with the sacrificial layer;

removing a portion of the sacrificial layer to form an opening through which a portion of the substrate is exposed;

performing a second ion implantation using the opening as a mask to implant ions for adjustment of a threshold voltage of the substrate;

forming a gate electrode on the substrate exposed through the opening; and performing a third ion implantation to adjust doping concentration in the gate electrode.

In forming the sacrificial layer, length of the sacrificial layer can be adjusted appropriately and, therefore, length of the remaining sacrificial layer on the substrate, which forms two spacers, can be adjusted. Such adjustment of length can prevent the effective channel length from being shortened. In addition, the present invention can prevent out-diffusion of ions, which are implanted to adjust the threshold voltage, by performing an ion implantation to adjust the threshold voltage after forming a source/drain region. Accordingly, the present invention can reduce the occurrences of a short channel effect and a reverse short channel effect in a transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
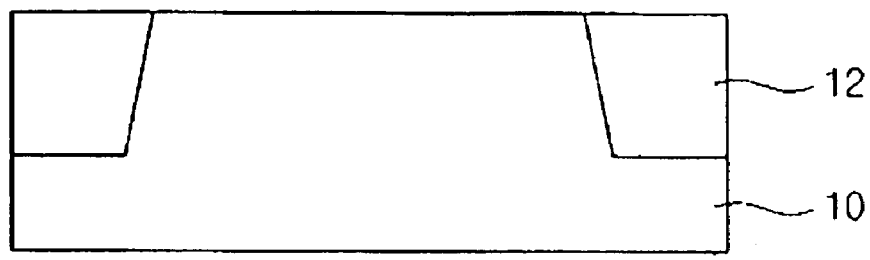
FIGS. 1a through 1e illustrate, in cross-sectional views, the process steps for forming a transistor of a semiconductor device according to a conventional art.
Figure 1B:
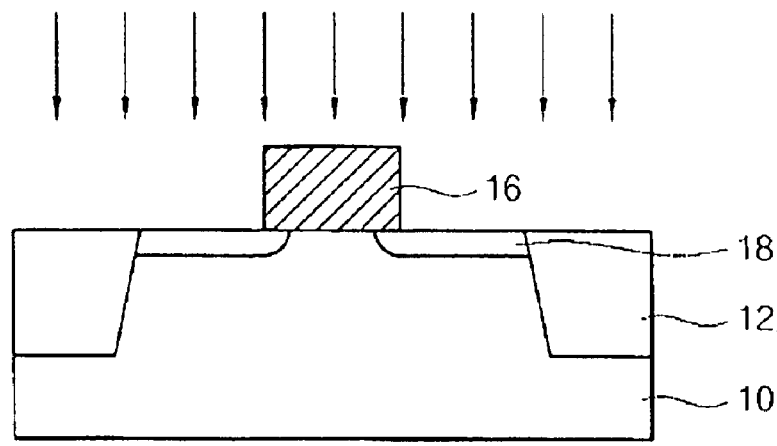
Figure 1C:
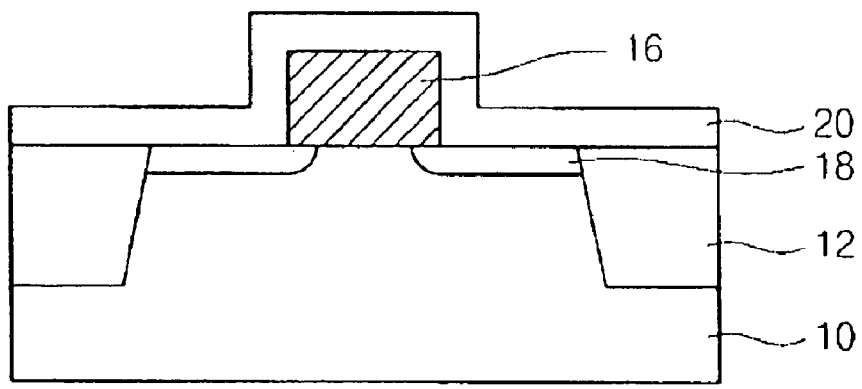
Figure 1D:
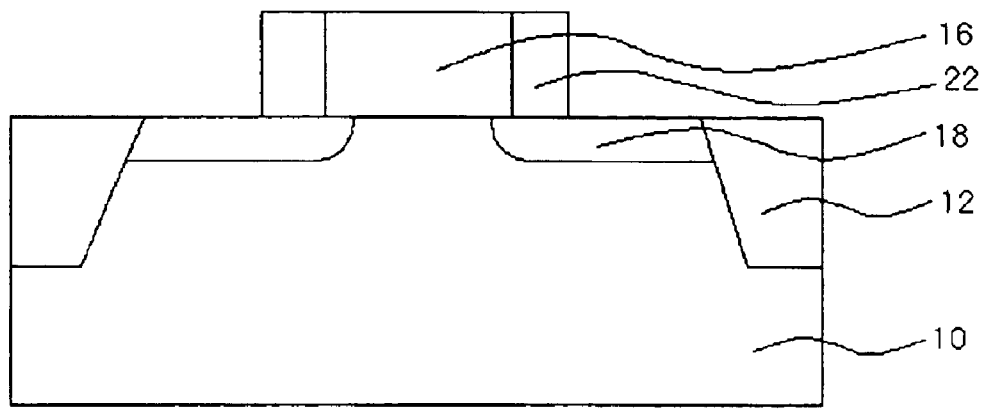
Figure 1E:
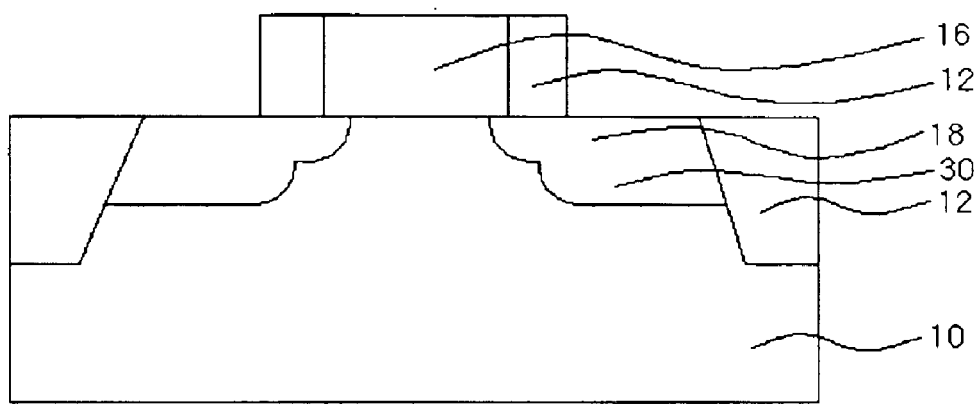
Figure 2A:
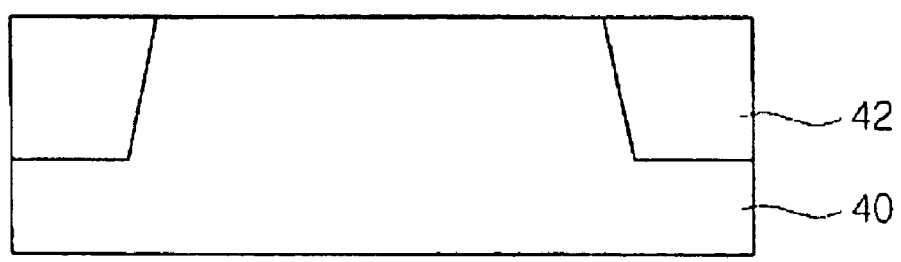
FIGS. 2a through 2f illustrate, in cross-sectional views, the process steps for forming a transistor of a semiconductor device according to the present invention.

Referring to FIG. 2a, a substrate 40 with device isolation layers 42 is provided. The device isolation layers 42 preferably have a trench structure. The trench structure has an advantage that it has a smaller area than a field oxide.

Figure 2B:
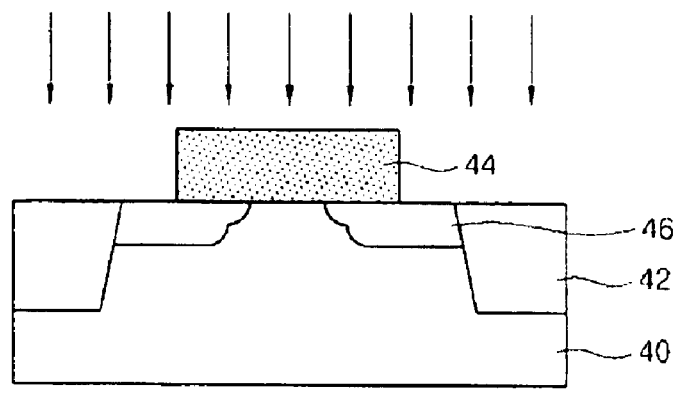

Referring to FIG. 2b, a sacrificial layer 44 is formed on the substrate 40. The sacrificial layer 44 is preferably made of silicon oxide or silicon nitride. In addition, the sacrificial layer 44 is formed only on an active region of the substrate 40 by means of patterning. In detail, a thin layer of sacrificial material is deposited on the substrate and some part of the thin layer is removed to form the sacrificial layer 44. Here, length of the sacrificial layer is appropriately adjusted so that length of two spacers to be formed later can be adjusted to prevent the effective channel length from being shortened. Next, an ion implantation is performed using the sacrificial layer 44 as a mask to form a source/drain region 46 in the substrate 40.

Figure 2C:
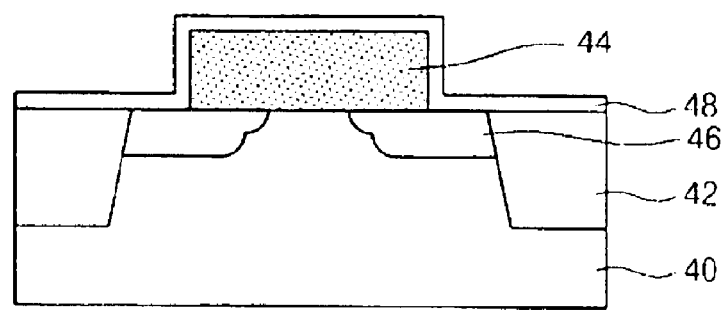

Referring to FIG. 2c, a barrier layer 48 is deposited over the substrate 40 including the sacrificial layer 44. The barrier layer 48 is preferably made of silicon nitride and has a thickness between 300 Å and 1,000 Å.

Figure 2D:
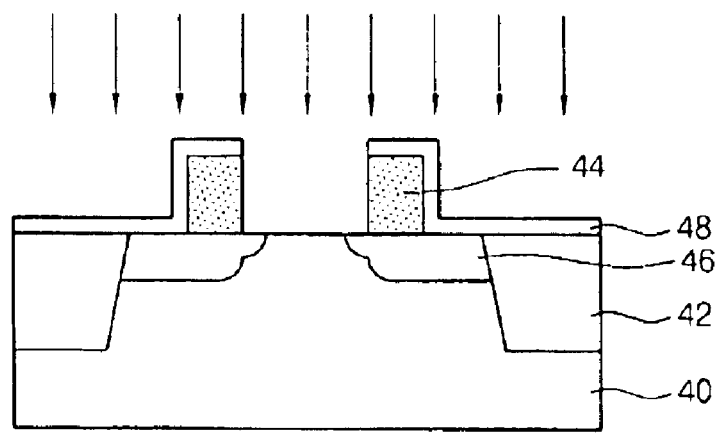

Referring to FIG. 2d, a portion of the sacrificial layer 44 is removed to form an opening through which a portion of the substrate 40 is exposed. In detail, portions of the barrier layer 48 and the sacrificial layer 44 are removed through a pattern mask formed by photolithography. Then, an ion implantation is performed using the opening as a mask in order to implant ions into the substrate 44 exposed. Here, the ions adjust a threshold voltage. The ion implantation to adjust the threshold voltage is performed after the ion implantation to form the source/drain region and, therefore, the heavy ions implanted first are not influenced by the light ions implanted later.

Figure 2E:
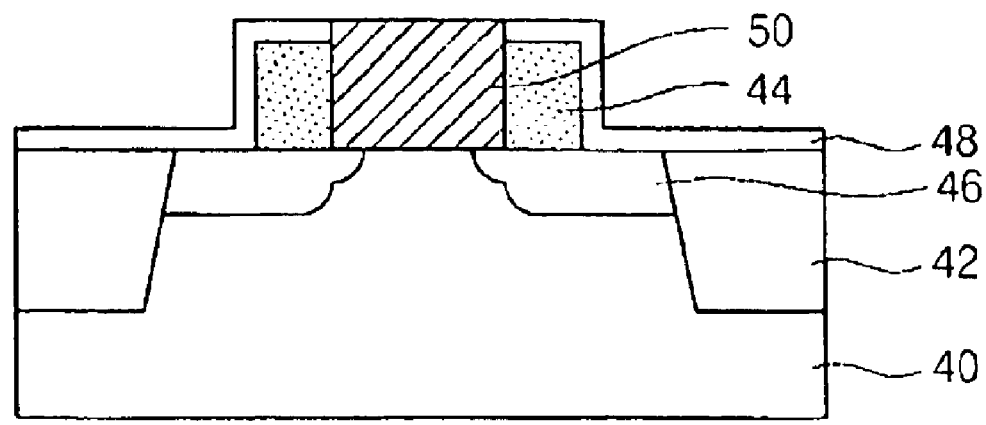

Referring to FIG. 2e, the opening through which the substrate 40 is exposed is filled with a conducting material to form a gate electrode 50.

Figure 2F:
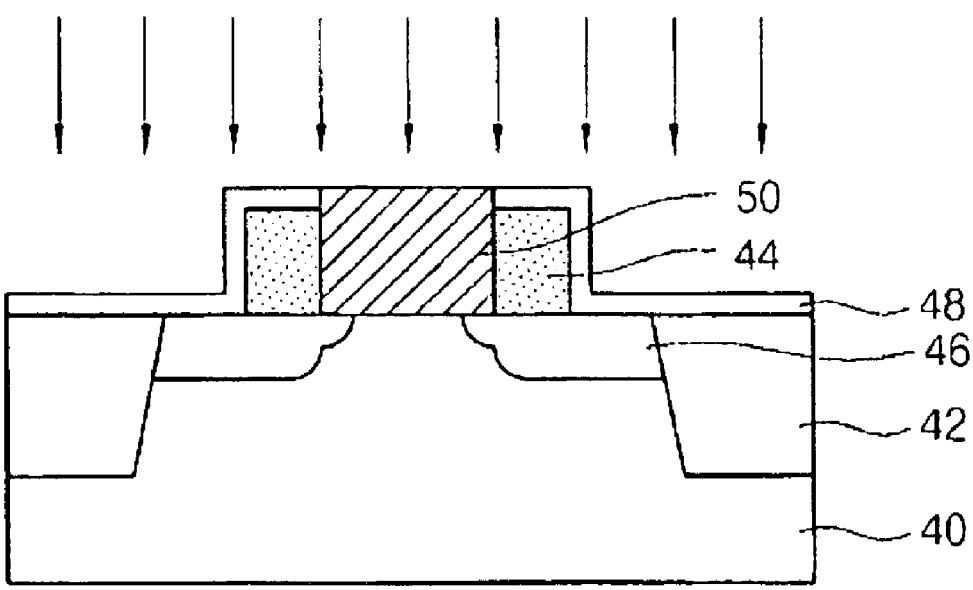

Referring to FIG. 2f, an ion implantation is performed on the gate electrode 50 in order to adjust doping concentration in the gate electrode. Here, ions are not implanted into the substrate 40 because the substrate is covered with the barrier layer 48. As a result, a transistor having the source/drain region 46 and the gate electrode 50 is formed on the substrate 40.

The present invention employs a sacrificial layer the length of which can be adjusted appropriately by patterning. Such length adjustment can prevent effective channel length from being shortened because, when a portion of the sacrificial layer is removed to form an opening in which a gate electrode is formed, length of the remaining sacrificial layer, which forms two spacers, can be adjusted. Therefore, by preventing the effective channel length from being shortened, a short channel effect is suppressed.

In the present invention, an ion implantation to adjust a threshold voltage is performed after source/drain regions are formed. Therefore, out-diffusion of ions due to collision is reduced and a reverse short channel effect is suppressed. Thus, the present invention can embody a transistor with electrically stable functions.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a transistor of a semiconductor device comprising the steps of:

forming a sacrificial layer on a substrate;

forming a source/drain region in the substrate by performing a first ion implantation using the sacrificial layer as a mask;

forming a barrier layer over the substrate with the sacrificial layer;

removing a portion of the sacrificial layer to form an opening through which a portion of the substrate is exposed;

performing a second ion implantation using the opening as a mask to implant ions for adjustment of a threshold voltage of the substrate;

forming a gate electrode on the substrate exposed through the opening; and performing a third ion implantation to adjust doping concentration in the gate electrode.

2. The method as defined by claim 1, wherein the sacrificial layer is formed of silicon oxide or silicon nitride.

3. The method as defined by claim 1, wherein the barrier layer is formed of silicon nitride and has a thickness between 300 Å and 1,000 Å.

* * * * *